(12) United States Patent
Heimberger et al.

(10) Patent No.: US 7,317,976 B2
(45) Date of Patent: Jan. 8, 2008

(54) OPERATING ELEMENT FOR MOTOR VEHICLE COMPONENTS

(75) Inventors: Hans-Dieter Heimberger, Oberursel (DE); Josef Werner, Schmitten/Dorfweil (DE)

(73) Assignee: Siemens Aktiengesellschaft, München (DE)

( * ) Notice: Subject to any disclaimer, the term of this patent is extended or adjusted under 35 U.S.C. 154(b) by 550 days.

(21) Appl. No.: 10/518,681

(22) PCT Filed: May 30, 2003

(86) PCT No.: PCT/DE03/01779

§ 371 (c)(1),
(2), (4) Date: Dec. 17, 2004

(87) PCT Pub. No.: WO04/001969

PCT Pub. Date: Dec. 31, 2003

(65) Prior Publication Data

US 2005/0228561 A1    Oct. 13, 2005

(30) Foreign Application Priority Data

Jun. 21, 2002   (DE) ................. 102 27 803

(51) Int. Cl.
*G06F 7/00* (2006.01)
(52) U.S. Cl. .......................... 701/36; 340/458
(58) Field of Classification Search ............. 701/1, 701/36; 340/438, 458, 459, 461
See application file for complete search history.

(56) References Cited

U.S. PATENT DOCUMENTS 6,936,394 B2 * 8/2005 Okado et al. ........... 430/111.33
7,123,135 B2 * 10/2006 Kaneda ..................... 340/438

FOREIGN PATENT DOCUMENTS

| DE | 199 36 385 A1 | 2/2001 |
| DE | 101 27 211 A1 | 1/2003 |
| EP | 0 570 870 A2 | 11/1993 |

\* cited by examiner

*Primary Examiner*—Richard M. Camby
(74) *Attorney, Agent, or Firm*—Cohen Pontani Lieberman & Pavane LLP

(57) ABSTRACT

An operator control element for motor vehicles includes a fixed base body, a handle which is mounted so as to be capable of rotating about an axis in the base body, display windows which are arranged radially around the axis, and an illumination device for illuminating at least one of the display windows. The illumination device has a plurality of light sources which are arranged radially around the axis of the handle on the fixed base body and can be switched individually. A lightguide element is permanently connected to the handle and has a light input face, which is successively moved past the light sources when the handle rotates, and a light output face, which is assigned to a photosensitive element. The photosensitive element is connected to an electronic circuit for evaluating the output signal of the photosensitive element, it being possible to determine a rotary position of the handle by successively switching the light sources and evaluating the output signal of the photosensitive element.

8 Claims, 1 Drawing Sheet

OPERATING ELEMENT FOR MOTOR VEHICLE COMPONENTS

PRIORITY CLAIM

This is a U.S. national stage of application Ser. No. PCT/DE2003/001779, filed on 30 May 2003. Priority is claimed on the following application(s): Country: Germany, Application No.: 102 27 803.2, Filed: 21 Jun. 2002.

BACKGROUND OF THE INVENTION

1. Field of the Invention

The invention relates to an operator control element for motor vehicles having a fixed base body, a handle which is mounted so as to be capable of rotating about an axis in the base body, display windows which are arranged radially around the axis, and an illumination device for illuminating at least one of the display windows. In addition, the invention relates to a method for determining the rotary position of a rotatable operator control element.

2. Description of the Prior Art

An operator control element of the type described at the beginning is known, for example, from DE 101 27 211. Such operator control elements are used, for example, in operator control units for motor vehicle air-conditioning systems as rotary switches for setting the air distribution or as rotary potentiometers for predefining a temperature value. Display windows which characterize the set state by means of symbols which are provided are arranged around the rotatable handle. So that the symbols can be recognized even when operating the device at night, a means of illuminating the display windows or one of the display windows which represents the set value is necessary. For this purpose, light sources are used in the form of light-emitting diodes and lightguides. The light-emitting diodes which are used to illuminate the symbols are actuated by a microcontroller of the operator control part in order to control the brightness of the display or switch it on/off. When the operator control elements are used in motor vehicles, a high degree of precision in the supplied state is required or it is necessary to perform standardization, for example on potentiometers.

SUMMARY OF THE INVENTION

An object of the invention is to provide an operator control element for motor vehicles with which the position of the handle, and thus the set value on the control unit, can reliably and easily be recognized. A further object of the invention is to specify a reliable method for determining the rotary position of a rotatable operator control element.

The aforementioned object is achieved by an operator control element of the generic type for motor vehicles in which an illumination device has a plurality of light sources which are arranged radially around the axis of the handle on the fixed base body and can be switched individually. A lightguide element is permanently connected to the handle and has a light input face, which is successively moved past the light sources when the handle rotates, and a light output face, which is assigned to a photosensitive element. The photosensitive element is connected to an electronic circuit for evaluating the output signal of the photosensitive element, it being possible to determine a rotary position of the handle by successively switching the light sources and evaluating the output signal of the photosensitive element.

The operator control element according to the invention thus firstly has a plurality of light sources which are arranged radially and preferably at the same angular interval from one another around the axis of the handle on the fixed base body of the operator control element. A lightguide element whose light input face is successively moved past the light sources when the handle rotates is permanently connected to the handle. With this configuration, light from in each case one of the light sources is input into the light input face of the lightguide element. The light which is input in this way is fed to a photosensitive element via the lightguide element. The photosensitive element is connected to an electronic circuit which evaluates the output signal of the photosensitive element. The electronic circuit also serves to actuate the individual light sources. If the individual light sources are then briefly, for example only for a few milliseconds, switched on in succession, a corresponding signal is generated by means of the photosensitive element if the light source which is assigned to the current position of the handle, and thus of the photosensitive element, is switched on. This is evaluated in the electronic circuit so that the position of the handle, and thus the setting value, can be unambiguously detected.

A method according to the invention for determining the rotary position of a rotatable operator control element in which a plurality of light sources are arranged radially around an axis of the operator control element, light from one of the light sources being fed to a photosensitive element as a function of the rotary position of the operator control element, therefore has the following method steps:

the light sources are switched on and off successively, the signal of the photosensitive element which is detected during the successive switching on and off of the light sources is evaluated in order to generate a signal sequence, the signal sequence which is obtained in this way is compared with stored signal sequences to which a position value has been assigned, when the signal sequence which is determined corresponds to a stored signal sequence, the associated position value is further processed as a setting value of a motor vehicle component.

If all the light sources are firstly switched off and then briefly switched on in succession, the signal sequence is composed only of a single signal value whose position depends on the set rotary angle. If the operator control element has, for example, twelve light sources and the lightguide element is positioned over the third light source, the signal sequence is firstly composed of the signal value "no light" twice, then of the signal value "light" once, and subsequently in turn of the signal value "no light" nine times. It is analogous if the light sources are all switched on, for example when the device is operating at night. The light sources are then successively switched off so that the following signal sequence is obtained in a way which is analogous to the above example. Firstly, the output signal "light" twice, as the lightguide is positioned above the third light source and only the first and second light sources are switched off. Then, as a third signal, "no light" as the light source above which the lightguide element is positioned is then switched off briefly and finally in turn the signal "light" nine times if the remaining nine light sources are switched off, but said light sources do not irradiate into the lightguide.

In the operator control element according to the invention, the light sources can be used in particular both for detecting the position of the handle, as has been described before, and directly for illuminating the individual display windows. For this purpose, the lightguide element is to be constructed and arranged in such a way that it covers only a part of the output face of each light source so that the remaining part of the light from the light source can be used to illuminate the display window. The latter can also take place in particular by means of lightguides.

In one particular embodiment, the photosensitive element is arranged on a printed circuit board which is a component of the base body, the printed circuit board extending perpendicularly to the axis of the operator control element. As a result, a particularly simple voltage supply of the photosensitive element or a particularly simple connection of the photosensitive element to the electronic circuit is possible.

In one particular embodiment, the photosensitive element is arranged in the axis of the handle. In this embodiment, a single photosensitive element is sufficient and the lightguide element can be of particularly simple design.

However, the operator control element can also have a plurality of photosensitive elements. In particular, with such a configuration it is possible to reduce the number of necessary light sources. If, for example, two photosensitive elements are provided and two lightguide elements or two branches of a lightguide element whose output faces are each assigned to one of the photo-sensitive elements, the two input areas, spatially separated from one another, of the two lightguide elements can detect different positions of the handle. For example, adjacent rotary positions A, B may be equipped with a light source or be without one. The light input face of the first lightguide element is located in a first rotary position above the light source in the position A, while the light input face of the second lightguide is located above the position B, which does not contain any light source. The light which is input into the first lightguide is then fed to the first photosensitive element. In a second rotary position, the second lightguide element is then located above the position A so that light is input into the second lightguide element and thus into the second photosensitive element. In this way, it is possible to distinguish between the two rotary positions with just one light source.

In one particular embodiment, the operator control element is embodied as a rotary switch. For this purpose, the operator control element has latching elements which define the individual rotary positions in which the light input face of the lightguide element is assigned to precisely one light source. The operator control element can be used here either as an absolute position sensor or as an incremental sensor for determining a relative position. In the latter case, during the adjustment process, the direction of rotation and the number of increments can be determined by suitably actuating the light-emitting diodes, for example before the rotating process and after the completion of the rotating process, by correspondingly actuating the light sources and evaluating the photo-sensitive signal.

In particular, the operator control element is suitable as a component of an operator control unit for a motor vehicle air-conditioning system and for supplying a setting value for the control unit of the air-conditioning system. The operator control element in the form of an absolute position sensor can be used here as an air distribution actuator or as a temperature selector. In the latter case, in particular further colored light sources, such as a red and a blue LED, may be present, with which light sources a minimum and a maximum temperature value are characterized.

BRIEF DESCRIPTION OF THE DRAWINGS

The invention is explained in more detail below with reference to an exemplary embodiment and the drawing, in which.

DETAILED DESCRIPTION OF THE PREFERRED EMBODIMENTS

Figure 1:
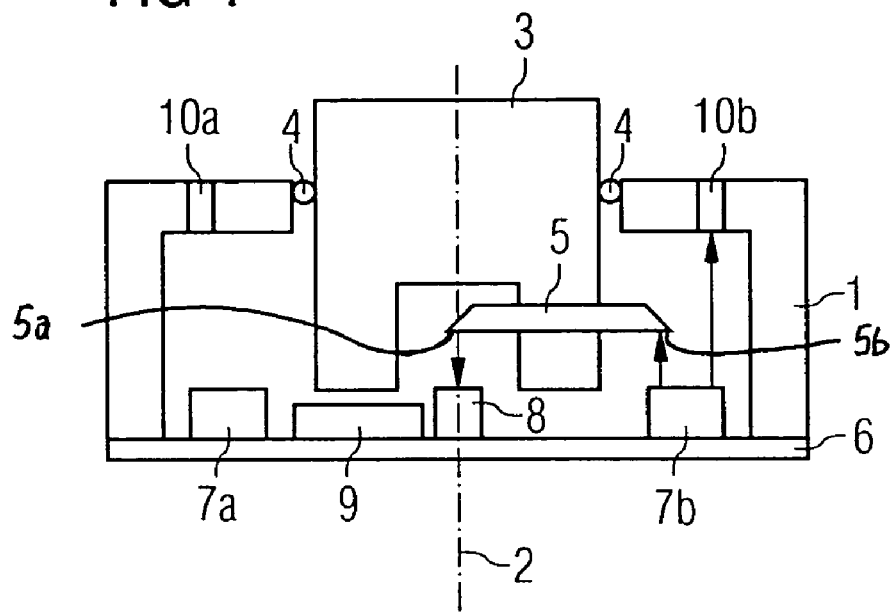
FIG. 1 is a sectional view of the operator control element according to the invention.

FIG. 1 is a sectional view of an operator control element according to the invention. The operator control element has a fixed base body 1. A handle 3 is mounted so as to be capable of rotating about the base body 1 about an axis 2 by means of the schematically illustrated bearing elements 4. A lightguide element 5, which is embodied here as a rod-shaped lightguide, but may also be merely composed of mirrored surfaces, is permanently connected to the handle 3. The base body 1 includes a printed circuit board 6 on which a plurality of light sources 7a, 7b (collectively referred to as light sources 7) are arranged in a ring around the axis 2. The light source 7b is switched on as a single light source in the example shown. The light of the light source 7b is input into an input face 5a of the lightguide element 5 and guided to the photosensitive element 8 which is also arranged on the printed circuit board 6. The photosensitive element 8 may be, in particular, a photodiode or a phototransistor. The photosensitive element 8 is arranged on the axis 2 of the handle 3. At the same time, the output face 5b of the lightguide element 5 is also arranged on the axis 2 so that, when the handle 3 rotates, the arrangement of the light output face 5b of the lightguide element 5 with respect to the photosensitive element 8 is always ensured. Furthermore, an electronic circuit 9 is arranged on the printed circuit board 6. The electronic circuit 9 is electrically connected to the photosensitive element 8 and evaluates the signals of the photosensitive element 8. Furthermore, the electronic circuit 9 is connected to the individual light sources 7 and supplies actuation signals for switching the light sources 7 on and off. In the fixed base body 1 of the operator control element there are also a plurality of display windows 10a, 10b (collectively referred to as display windows 10) which are also arranged on a circular ring around the axis 2. The number of display windows 10 corresponds to the number of light sources 7. The arrangement of the lightguide element 5, of the light source 7b and of the display window 10b is such that part of the light emitted by the light source 7b is input into the lightguide 5 in a corresponding rotary position of the handle 3. At the same time, part of the light of the light source 7b is used to illuminate the display window 10b. This can ensure that the display window 10b is illuminated when the device is operated at night. The same applies to the other light sources and the associated display windows. However, the lightguide element 5 only ever inputs light from one of the light sources 7 into the photosensitive element 8.

Figure 2:
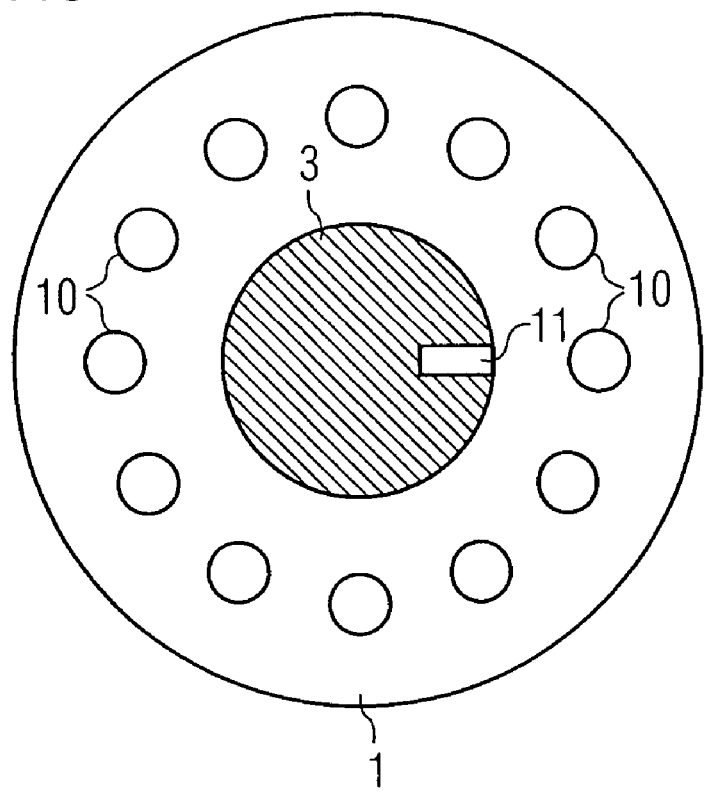
FIG. 2 is a plan view of the operator control element.

FIG. 2 shows a plan view of the operator control element with the fixed base body 1 and the handle 3. In the exemplary embodiment shown, twelve display windows 10 are arranged in the form of a circular ring around the handle 3 in the base body 1. One of the light-emitting diodes 7 is located underneath each of the display windows 10. The operator control element also has latching elements (not illustrated) which ensure that only one of the twelve possible settings can be made. The handle 3 contains a marker 11 by means of which the current position of the operator control element is signaled to the user.

The position of the operator control element according to the invention can then be detected as follows: the light sources 7 which are initially switched off are briefly switched on in succession. If, in the process, a change in brightness is detected by the photosensor, it is possible to determine which of the light sources has just been switched on when the detected change in brightness took place. The position of the lightguide element which must be located above the corresponding light source, and the position of the handle, are thus known. An input value which corresponds to this position can then be passed on to the control unit of the air-conditioning device. The control unit of the air-conditioning system may in particular also be implemented on the printed circuit board 6 in the form of the electronic circuit 9. In this case, the printed circuit board 6 is not merely a component of a single operator control element but, for example, of a complete operator control unit which also already contains the control circuit.

What is claimed is:

1. An operator control element for motor vehicles, comprising:
   a fixed base body;
   a handle rotatably mounted on said base body for rotating about an axis, said base body having a plurality of windows arranged in circumferential succession about said axis;
   an illumination device for illuminating at least one of said plural windows, said illumination device including a plurality of light sources arranged on said base body in circumferential succession about said axis;
   a photosensitive element connected to an electronic circuit; and
   a lightguide element connected to said handle and having a light input face and a light output face, said light input face being moved past said light sources when said handle is rotated, and said light output face being assigned to face said photosensitive element for guiding light from one of said light sources aligned with said light input face to said photosensitive element, said electronic circuit being arranged and dimensioned for successively switching the light sources and determining a rotary position of the handle based on the output signal generated by said photosensitive element in response to the successive switching of said light sources.

2. The operator control element of claim 1, wherein said one of said light sources aligned with said input face irradiates both into the input face and into one of said plural display windows.

3. The operator control element of claim 1, further comprising a printed circuit board arranged in said base body and extending perpendicularly to said axis, said photosensitive element being arranged on said printed circuit board.

4. The operator control element of claim 1, wherein said photosensitive element is arranged on said axis.

5. The operator control element of claim 1, further comprising a plurality of photosensitive elements.

6. The operator control element of claim 1, wherein said operator control element is a rotary switch.

7. The operator control element of claim 1, wherein said operator control element is a component of an operator control unit for an air-conditioning system and supplies a setting value for a control unit of the air conditioning system.

8. A method for determining a rotary position of a rotatable operator control element for a motor vehicle component, the rotatable operator control element having a plurality of light sources arranged in circumferential succession about an axis of the operator control element, wherein light irradiating from one of the plural light sources is fed to a photosensitive element as a function of the position of the operator control element, said method comprising the steps of:
   successively switching the light sources on and off;
   evaluating a signal output from the photosensitive element during the step of successively switching to generate a signal sequence;
   comparing the generated signal sequence to stored signal sequences assigned to respective position values;
   determining an associated one of the stored signal sequences that corresponds to the generated signal sequence; and
   processing the associated one of the stored signal sequences as a setting value of the motor vehicle component.

* * * * *